US007023221B1

(12) United States Patent
Lin

(10) Patent No.: US 7,023,221 B1
(45) Date of Patent: Apr. 4, 2006

(54) STRUCTURE OF OBJECT PROXIMITY AND POSITION DETECTOR

(75) Inventor: Shyuh Der Lin, Hsinchu (TW)

(73) Assignee: Holylite Microectronics Corporation, (TW)

( * ) Notice: Subject to any disclaimer, the term of this patent is extended or adjusted under 35 U.S.C. 154(b) by 0 days.

(21) Appl. No.: 11/125,598

(22) Filed: May 9, 2005

(51) Int. Cl.
*G01R 27/26* (2006.01)

(52) U.S. Cl. ...................................... 324/662; 324/667

(58) Field of Classification Search ................ 324/662, 324/667; 382/123; 331/65
See application file for complete search history.

(56) References Cited

U.S. PATENT DOCUMENTS 6,724,324 B1 * 4/2004 Lambert ...................... 341/33
2004/0043696 A1 * 3/2004 Suzuki ....................... 446/268

* cited by examiner

*Primary Examiner*—Walter Benson
(74) *Attorney, Agent, or Firm*—Perkins Coie LLP

(57) ABSTRACT

The present invention offers an object proximity detector and an object position detector. The variation of frequency of an oscillator is used to detect the proximity of an object to the sensor plates. The dependence of frequency on process parameter is minimized by a compensation capacitor. It is not need to calibrate the product during the manufacture. In order to magnify the sensitivity, the sensor plates are placed in the feedback loop of the oscillator, instead of at the input of the oscillator. The independence of the process parameter and increasing of the sensitivity can be achieved by adding the compensation capacitor and place the sensor plates in the feedback loop at the same time. Multiple transmission gates are connected to the input and the output of the oscillator, and the sensor plates are connected to the transmission gates to form an object position detector.

12 Claims, 12 Drawing Sheets

STRUCTURE OF OBJECT PROXIMITY AND POSITION DETECTOR

BACKGROUND OF THE INVENTION

1. Field of the Invention

The present invention relates to an object proximity detector and an object position detector. In particular, the present invention relates to a position detector with multiple transmission gates connected to the input and output of an oscillator and sensor plates connected to the transmission gates.

2. Description of the Related Art

Modern proximity detectors have been used to indicate when one object is close to a detector and to measure how far away one object is from the detector. Capacitive sensors and inductive sensors often are used in proximity detectors. Capacitive proximity sensors translate the variation of capacitance to a binary signal, to determine whether that effective capacitance has been exceeded. The variation of capacitance relates to a distance between an object and the sensor plate/plates. There are a variety of well-known ways of measuring capacitance between the sensor plates. One way is to feed an AC signal to an amplifier through sensor plates and to measure the variation of amplitude of AC signal at the output of amplifier. The technology is used in U.S. Pat. No. 5,374,787, U.S. Pat. No. 5,495,077, U.S. Pat. No. 5,841,078, to Robert J. Miller et al., U.S. Pat. No. 5,914,465, U.S. Pat. No. 6,239,389B1, to Timothy P. Allen et al., U.S. Pat. No. 6,028,271, U.S. Pat. No. 6,610,936B2, to David W. Gillespie et al. The system uses this technology consists of a lot of analog circuit, such as amplifier, filter, minimum selector, subtract circuit, sample/hold and A/D converter. The chip size of analog circuit is much bigger than that of digital circuit in an integrated circuit, and is not cost effective. The technology used in U.S. Pat. No. 6,452,514 B1 and U.S. Pat. No. 6,466,036 B1, to Harald Philipp is a charge transfer circuit. In this circuit, an AC voltage source is applied to one plate of the sensor and fed into a signal processor through the other plate of the sensor. The signal processor consists of charge transfer circuit, integrator and voltage measurement circuit. Also a lot of analog circuits used in the above technology. Besides the analog circuits, a lot of high speed analog switches are used. The clock feed-through caused by the parasitic capacitance of analog switches will cause the distortion of the signal. David W. Caldwell et al in U.S. Pat. No. 5,572,205, teaches a touch control system. In this system also apply an AC voltage source to one plate of the sensor and fed to a signal processor through the other plate of the sensor. The signal processor consists of analog circuits, such as peak detector, amplifier and A/D converter. The interference from RF signal will add to the peak detector directly, and caused the error detection of the system. One of the other ways is to connect the sensor plates at the input of an oscillator. The variation of capacitance at the input of oscillator will cause the variation of oscillator frequency. By detection of variation of frequency, the proximity of an object to the sensor plates will be detected. The technology is used in U.S. Pat. No. 6,583,676B2, to Christoph H. Krah et al. The frequency of the oscillator depends on the parameters of process and the power supply voltage. The proximity detectors require frequent calibration to compensate those variations. As described in the patent, the prior art uses two capacitors and a transistor to emulate when the sensor plates of the oscillator is in the proximity or not in the proximity by an object. Because the capacitors and transistor are built in the integrated circuit, the sensitivity of the proximity detector is difficult to be changed and also is difficult to be programmed externally. In order to avoid the frequent calibration of the object proximity sensor, we need to design an oscillator such that the dependence of frequency on process parameters and power supply is reduced to a minimum. The invention is to add addition circuit to the system to compensate the process dependence of oscillator frequency. One of the RC oscillator which is used commonly in the prior art is described in FIG. 1. This circuit consists of three inverters, 101, 102, 103, a 10; resistor 104, a capacitor 106, a pair of sensor plates 105 with capacitance $C_s$. The first stage, 101, is an inverter with Schmitt trigger input. A resistor 104 in the feedback loop of the oscillator is used as the charging/discharging element of the circuit. The frequency of the oscillator is determined by the resistor 104 and the capacitors 105, 106. The waveform of the circuit is shown in FIG. 2. Where $VTR_2$ and $VTR_1$ are two transfer voltages of the Schmitt trigger input inverter 101. During the charging cycle of the circuit, when the voltage at the input of the inverter 101 arrives at $VTR_2$, the output of the inverter 103 changes state and the circuit starts to a discharge cycle. The voltage at the input of the first inverter 1101 sweeps between $VTR_2$ and $VTR_1$. The period of the oscillator is proportional to $R(C_s+C)\ (VTR_2-VTR_1)/(V_{cc}-(VTR_2+VTR_1)/\mathbf{2})+dt$, where dt is the propagation delay of the inverters, and $V_{cc}$ is the power supply voltage. From the equation, we know, the frequency depends a lot on the transfer voltages $VTR_2$ and $VTR_1$. If the circuit is designed by CMOS process, the voltage gap, $VTR_2-VTR_1$, depends a lot on the threshold voltages of PMOS and NMOS transistors. If the power supply voltage decreases, $VTR_2-VTR_1$ will decreases and dt will increase. Because the propagation delay is very small in an integrated circuit, the increasing of dt is not enough to compensate the decreasing of $VTR_2-VTR_1$.

OBJECTS OF THE INVENTION

It is therefore an object of the invention to provide a position detector with sensitivity independent of the variation of process parameters.

It is another object of the invention to provide a position detector with high sensitivity.

It is yet another object of the invention to provide a proximity detector with sensitivity independent of the variation of process parameters.

It is yet a further object of the invention to provide a proximity detector with high sensitivity.

DISCLOSURE OF THE INVENTION

A first aspect of the present invention teaches an oscillator circuit of an object proximity detector or an object position detector. In the circuit, an addition capacitor is added. This capacitor is used to add to the voltage swing at the input of Schmitt trigger inverter. This part of voltage gap is proportional to the supply voltage, VCC, but independent of the threshold voltage of the PMOS and the NMOS transistors in the circuit. Two factors cancel each other, and the dependence of oscillator frequency on process parameters and power supply voltage is reduced to a minimum. Besides the independence of process parameters, the sensitivity of the sensor is important also. If dCs is the variation of the capacitance of sensor plates in FIG. 1, the variation of period of the oscillator is dT/T=dCs/(C+Cs). If C>>dCs, the sensitivity is low. Another aspect of the present invention teaches a method to increase the sensitivity by connecting the sensor plates to the input and output of the oscillator. The sensitivity will increase by a factor of 2VCC/(VTR2−VTR1). If VCC>>VTR2−VTR1, the increment of sensitivity is very high. The independence of process parameter and high sensitivity can be maintained at the same in a circuit by combining the advantages of the two circuits.

In order to detect the proximity of an object, the object proximity detector consists of an oscillator, a pair of sensor plates, a counter and a microprocessor. During the detection period of the system, a reference count ($N_0$) is always updating. This reference count is defined as the counting number when there is not object in proximity of the sensor. And the reference count is also the maximum count ever measured during the counting process.

A predetermined number ($N_r$) can be input to the microprocessor and used to define the sensitivity. In order to detect the proximity of an object, the counter counts the frequency of oscillator. If the counting number for a definite period is $N_x$, $N_0-N_x$ can measure the proximity of an object to the sensor. When $(N_0-N_x)>N_r$ is measured, we can determine that an object is in proximity to the sensor. A small $N_r$ means a more sensitive system. The preceding method teaches us how to detect an object in proximity of a sensor. The technology can be expanded and modified to detect an object in proximity of an array of sensors, and to distinguish which sensor in the array is detected.

Another preferred embodiment of the present invention teaches an object position detector. In order to design the object position detector, M transmission gates are connected in parallel at the input of the oscillator and N transmission gates in parallel at the output of the oscillator. The output of these transmission gates can be used to form an M×N matrix. A sensor key is formed by a pair of sensor plates, a sensor plate can be connected to one of the M transmission gates and the other sensor plate can be connected to one of the N transmission gates. The control gates of these transmission gates are connected to the outputs of a microprocessor, and are scanned sequentially by the microprocessor. A predetermined number ($N_r$) can be input to the microprocessor and used to define the sensitivity of each key. The reference count, $N_0$, of each key can be updated during the scanning of the key matrix. If $(N_0-N_x)>N_r$ is measured during the scanning of the key matrix, we can determine that an object is in proximity to that key of key matrix. The analog circuits in our invention only consist of an oscillator and two arrays of transmission gates. The circuit of the invention is much simple as compare to the circuit used in the prior art,

BRIEF DESCRIPTION OF THE DRAWINGS

The foregoing and other advantages of the invention will be more fully understood with reference to the description of the best embodiment and the drawing wherein.

DESCRIPTION OF THE PREFERRED EMBODIMENTS

Figure 1:
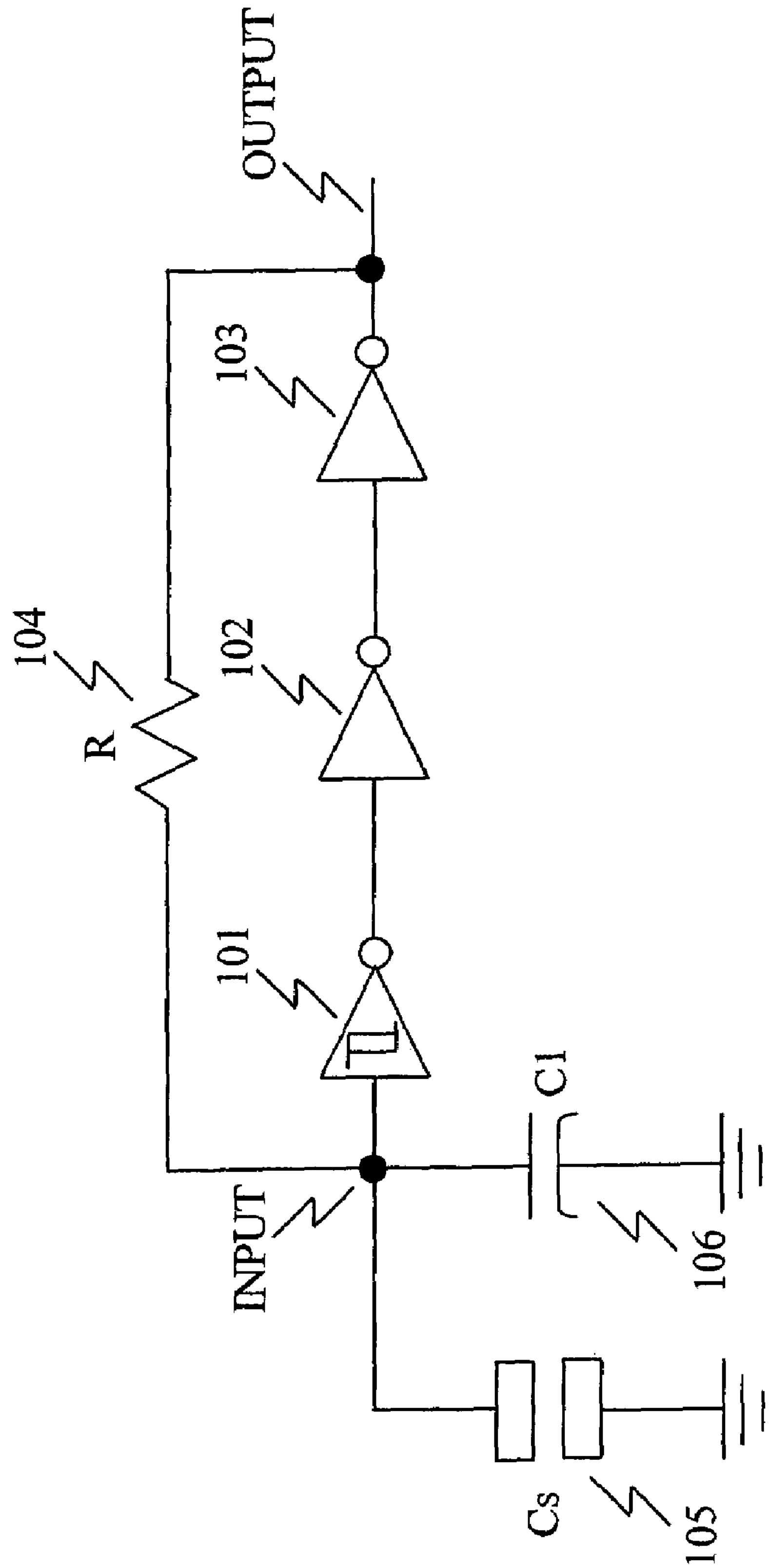
FIG. 1 is a circuit diagram of the oscillator used in proximity detector of the prior art.
Figure 2:
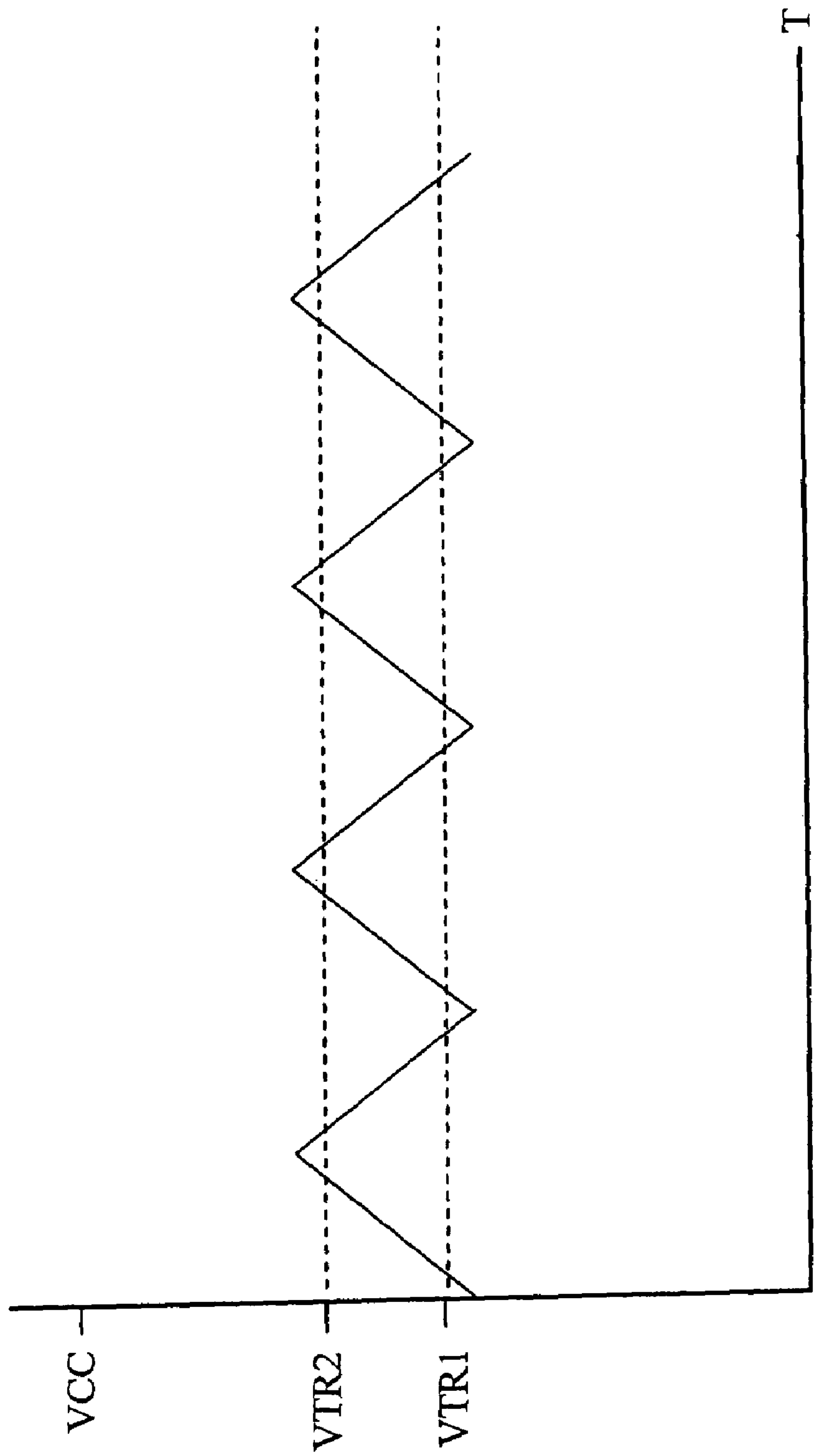
FIG. 2 is the timing diagram to illustrate the function of circuit in FIG. 1

The foregoing and other advantages of the invention will be more fully understood with reference to the description of the best embodiment and the drawing as the following description.

Proximity sensing technology is useful for applications where an object or a finger is in proximity or touches a sensor plates. And a position sensing technology is useful for application where an object or finger position need to be detected in a sensor array.

Figure 3:
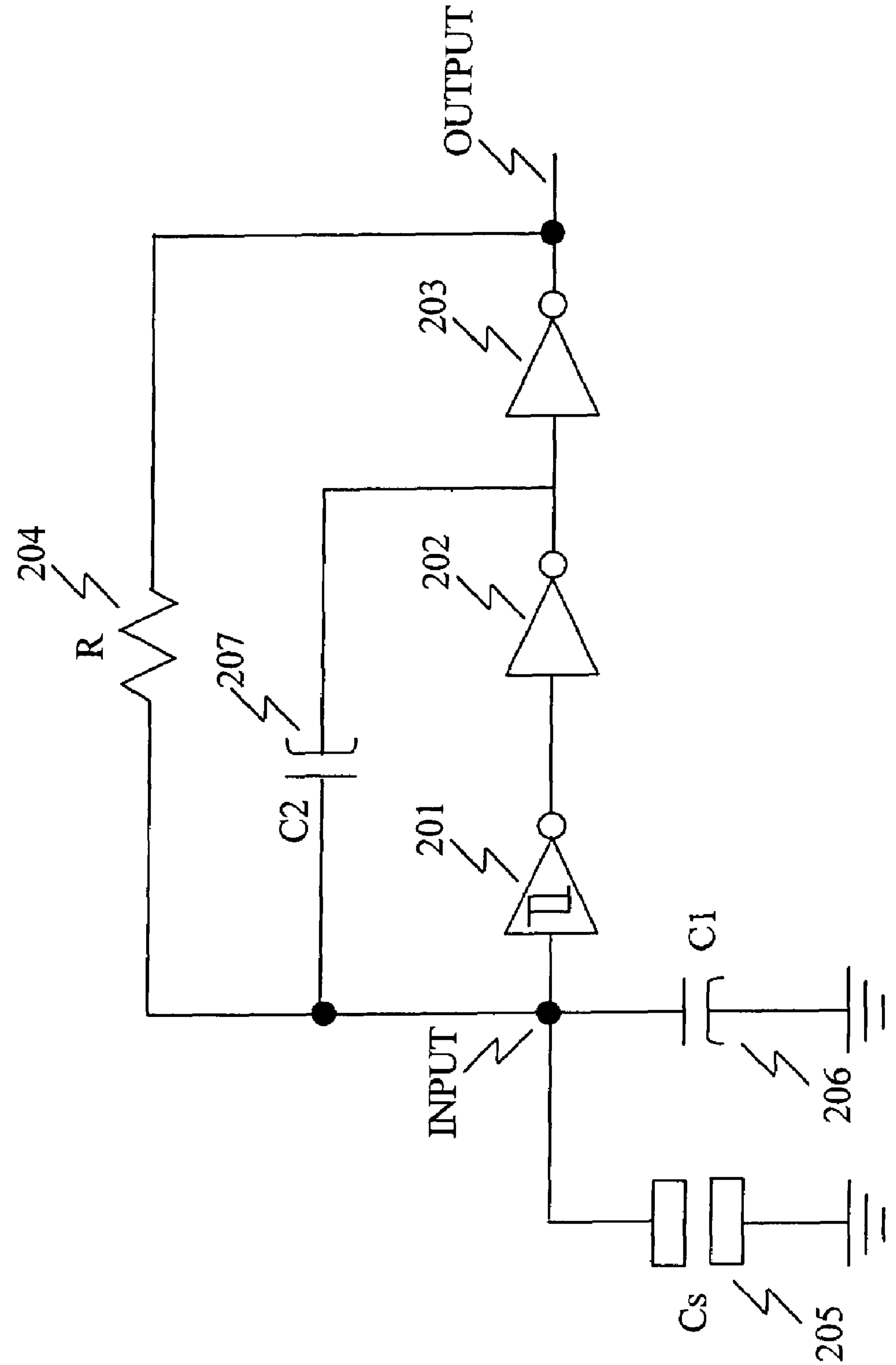
FIG. 3 is the oscillator circuit of an object proximity detector or an object position detector in according to one embodiment of the present invention. This oscillator will improve the frequency dependence on process variation.
Figure 4:
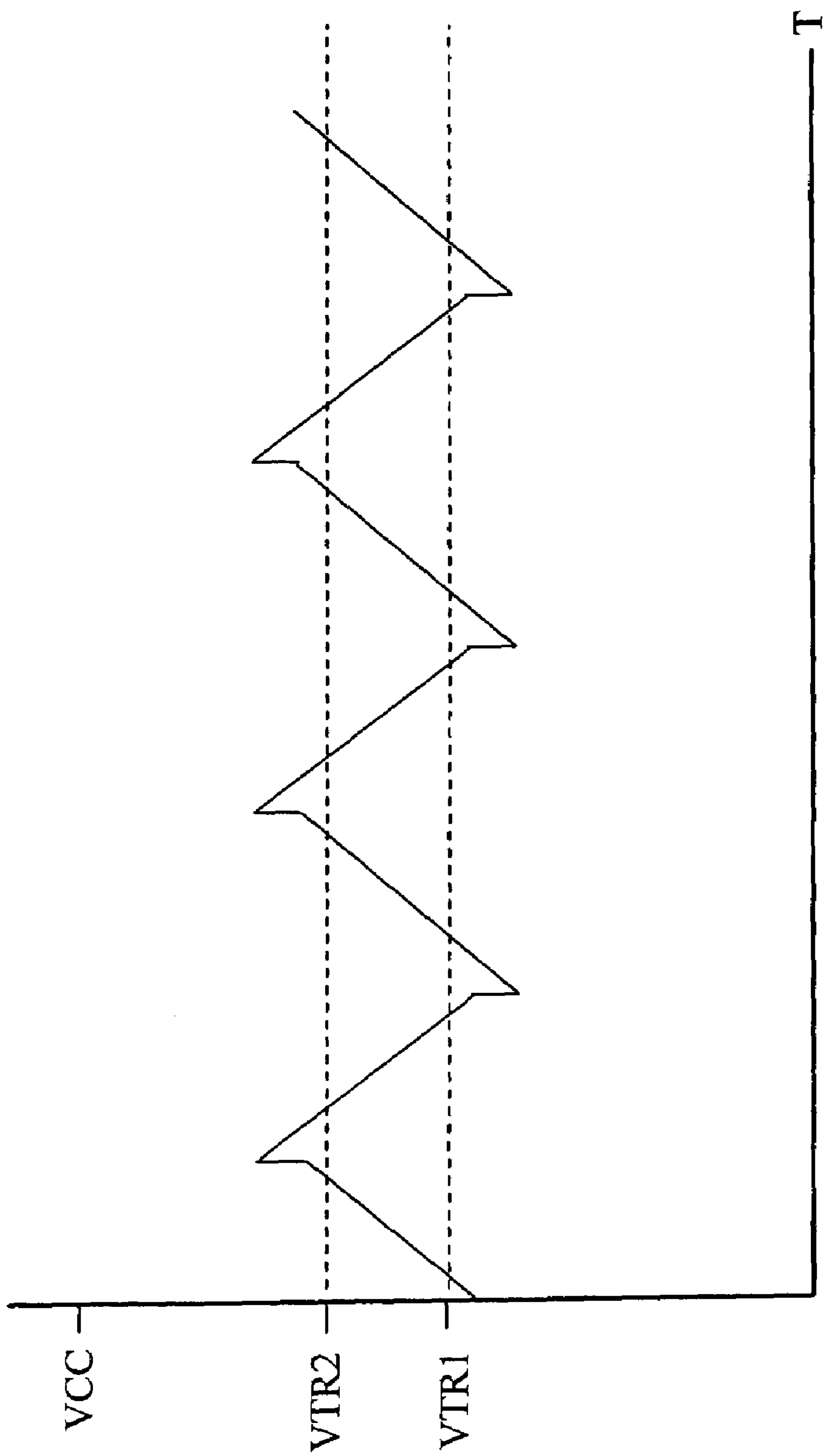
FIG. 4 is the timing diagram to illustrate the function of circuit in FIG. 3

One embodiment of a proximity sensing circuit or an object position detector of the present invention consists of at least a pair of sensor plates, a sensor oscillator, a time base oscillator, a counter and a microprocessor. In most of application, frequency of the oscillator independent to the variation of process parameters is important. Also high sensitivity is also required. FIG. 3 is an oscillator circuit of the present invention which can compensate the variation of frequency caused by process parameters. And FIG. 4 is the timing diagram of voltage at the input of oscillator in FIG. 3. As shown in FIG. 3, the oscillator consists of three inverters, a first inverter 201, a second inverter 202 and a third inverter 203 are in cascaded; a capacitor 206 is connected between the input of the inverter 201 and the ground; a pair of sensor plates 205 is also connected between the input of the inverter 201 and the ground; a compensate capacitor 207 is connected between the input of the inverter 201 and the output of the inverter 202; a resistor 204 is connected between the input of the inverter 201 and the output of the inverter 203. The feedback resistor 204 is used to charge and discharge the capacitors 205, 206 and 207 at the input of the oscillator. The first inverter 201 is an inverter with Schmitt trigger input. The inverter has two transfer voltages $VTR_2$ and $VTR_1$. During the charging state, the transfer voltage is $VTR_2$. During the discharging state, the transfer voltage is $VTR_1$. When the voltage at the input of the inverter 201 is increasing to a level of $VTR_2$, the output of the inverter 201 will in change state. Waiting for a propagation delay time, the output of inverter 202 will change state. The voltage jump at the output of inverter 202 will propagate through the capacitor 207 to the input of the inverter 201. The voltage range of the charging and discharging at the input of the oscillator in FIG. 3 consists of three parts. The first part is $VTR_2-VTR_1$. The second part is that caused by the capacitor 207, which is $2V_{CC}(C_2/(C_1+C_2+C_s))$. The third part is that caused by propagation of the inverters 201,202 and 203. $VTR_2-VTR_1$ will decrease if the threshold voltages increase. By the increasing of the internal resistance of the inverter with threshold voltage, the charging or discharging current will decrease if the threshold voltages increase. Thus if the threshold voltage increase, the charging time for $VTR_2-VTR_1$ will decrease, the charging time for $^2V_{CC}(C_2/(C_1+C_2+C_s))$ will increase and propagation delay will increase. By proper choice of the capacitors 205, 206 and 207, the dependence of time period of the oscillator on the process parameters will be reduced to a minimum value. Thus the dependence of frequency of the oscillator on the process parameters will be reduced to a minimum also. And the calibration of the oscillator frequency during manufacture is not necessary.

Figure 5:
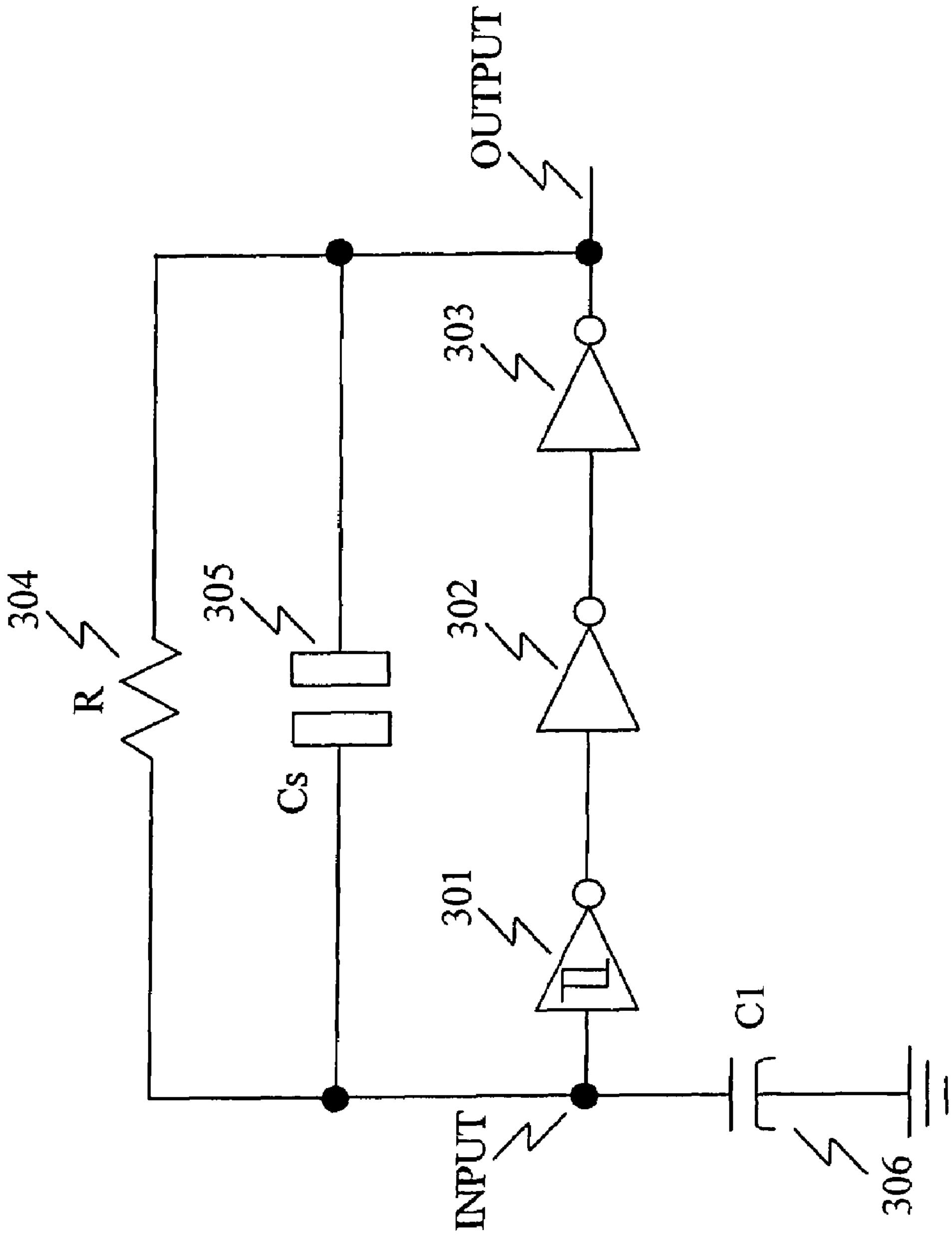
FIG. 5 is the oscillator circuit of an object proximity detector or an object position detector in according to one embodiment of the present invention. This oscillator will improve the sensitivity of the system.
Figure 6:
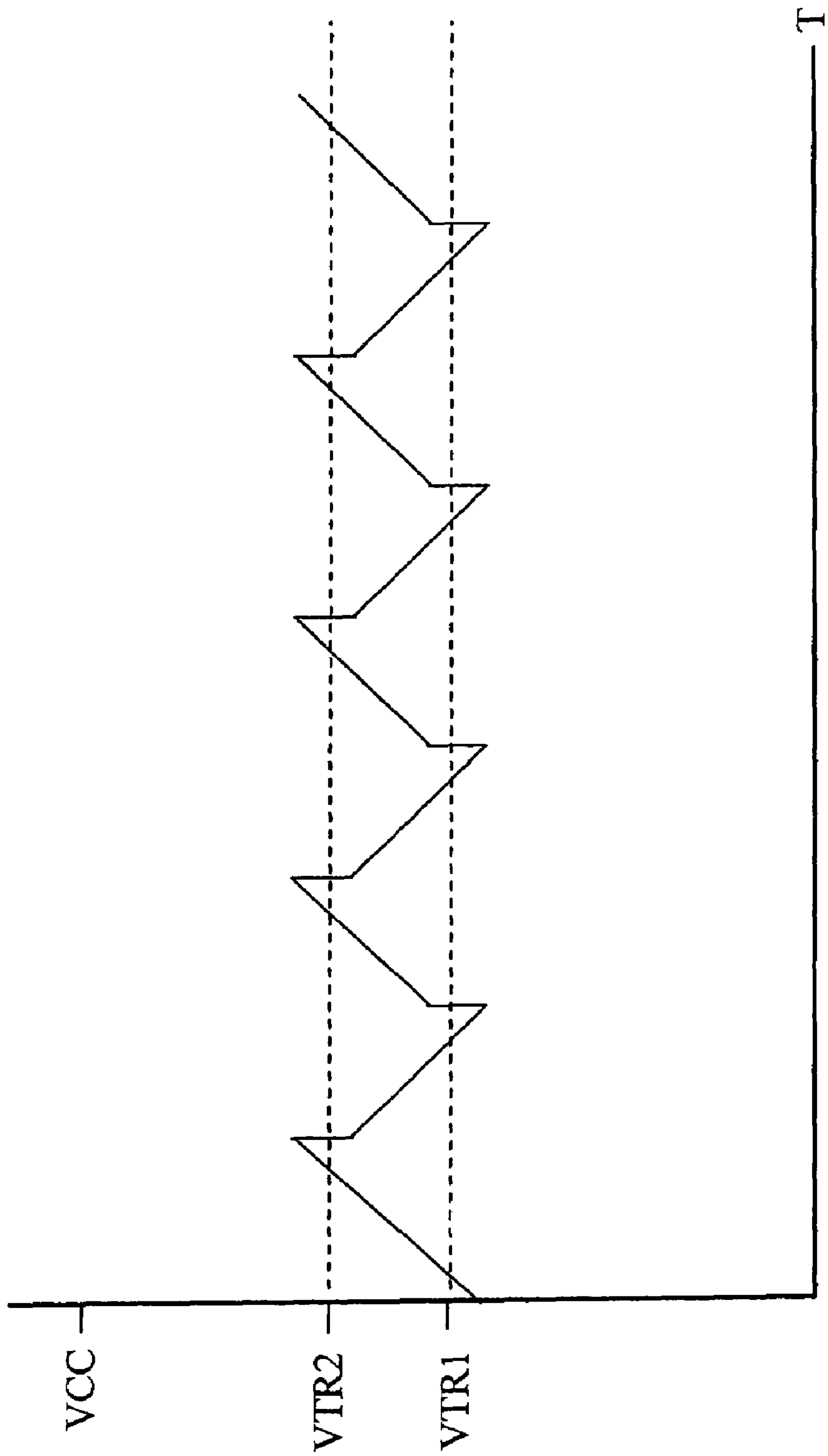
FIG. 6 is the timing diagram to illustrate the function of circuit in FIG. 5

The other circuit of the present invention is shown in FIG. 5. And the timing diagram is shown in FIG. 6. In this circuit, the sensor 305 is connected between the input of the inverter 301 and the output of the inverter 303. In this circuit, the transition at the output of the inverter 303 is $V_{CC}$. The variation of the time period caused by the variation of the sensor capacitance is $dT/T=(dCs/(Cs+C1))((2Vcc/(VTR2-VTR1))$. The sensitivity of the circuit in FIG. 5 is magnified by a factor of $2V_{CC}/(VTR_2-VTR_1)$, as compared with the oscillator circuit in FIG. 1.

Figure 7:
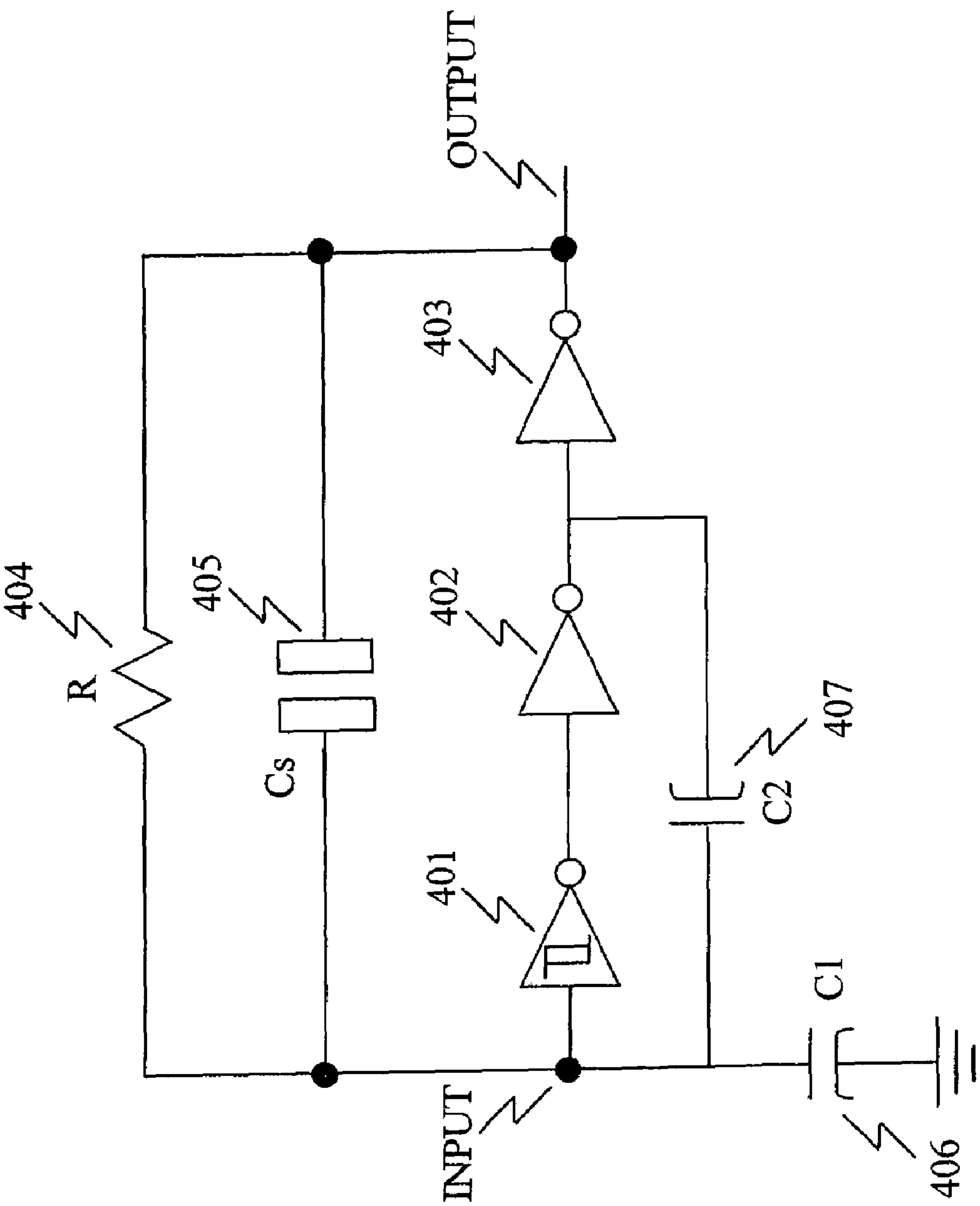
FIG. 7 is the oscillator circuit of an object proximity detector or an object position detector in according to one embodiment of the present invention, this oscillator will improve the frequency dependence on process variation and the sensitivity of the system.
Figure 8:
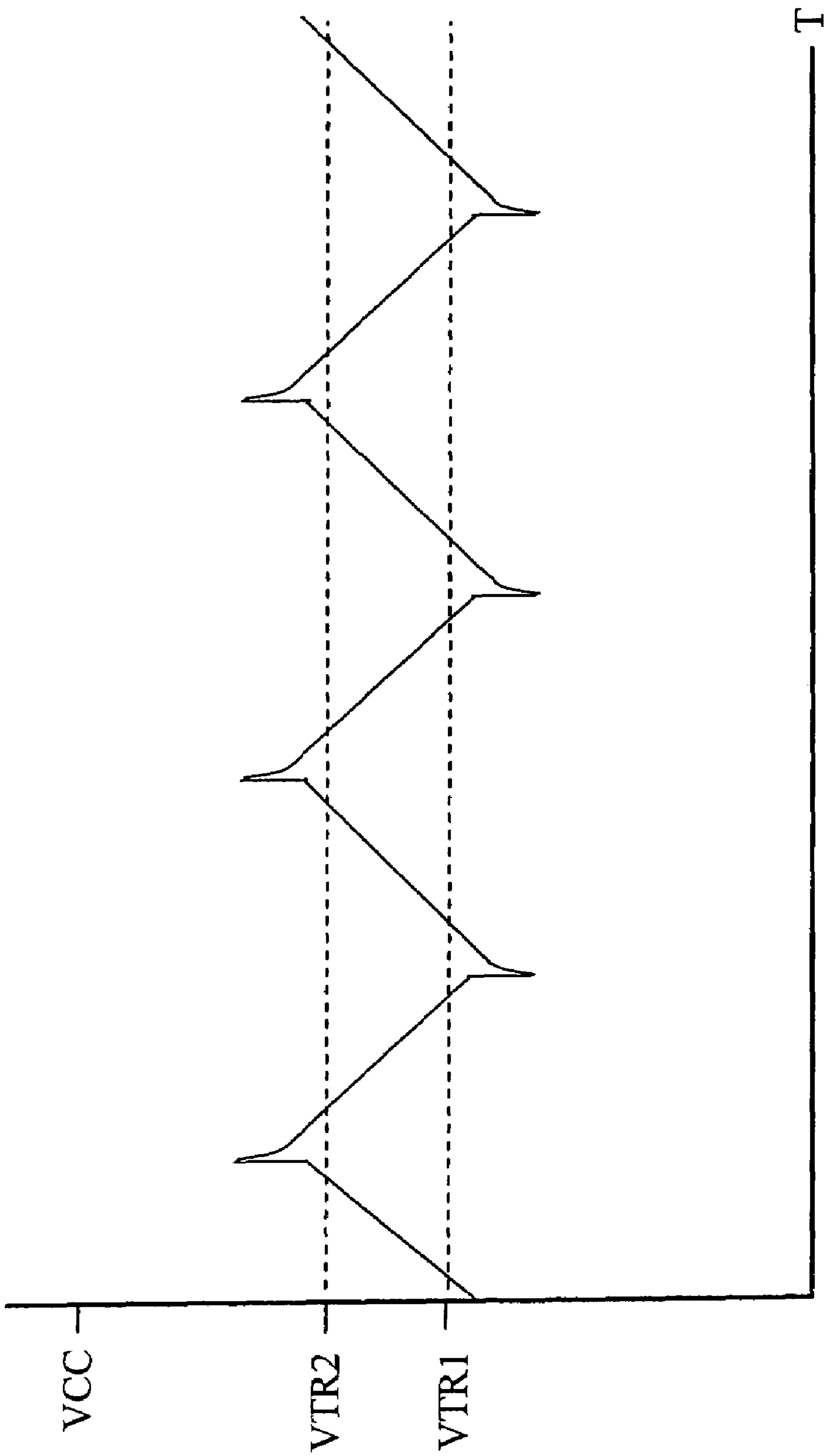
FIG. 8 is the timing diagram to illustrate the function of circuit in FIG. 7.

In order to improve the dependence of the frequency on the process parameters and the sensitivity of the sensor at the same time, we can combine the advantages of the circuits in FIG. 3 and in FIG. 5 together. The circuit with this characteristic is shown in FIG. 7. And the timing diagram of the circuit is shown in FIG. 8. In this circuit, the sensor capacitor 405 is connected between the output of the inverter 403 and the input of the inverter 401. The compensating capacitor is connected between the output of the inverter 402 and the input of the inverter 401. The effect of the capacitor 407 will be cancelled partially by the capacitor 405. As the charging range at the input of the inverter 401 is concerned, the capacitance of the capacitor 407 must larger than that of the capacitor 405. By proper choice of capacitance of capacitors 405, 406 and 407, the dependence of frequency on process parameter can be reduced to a minimum.

Figure 9:
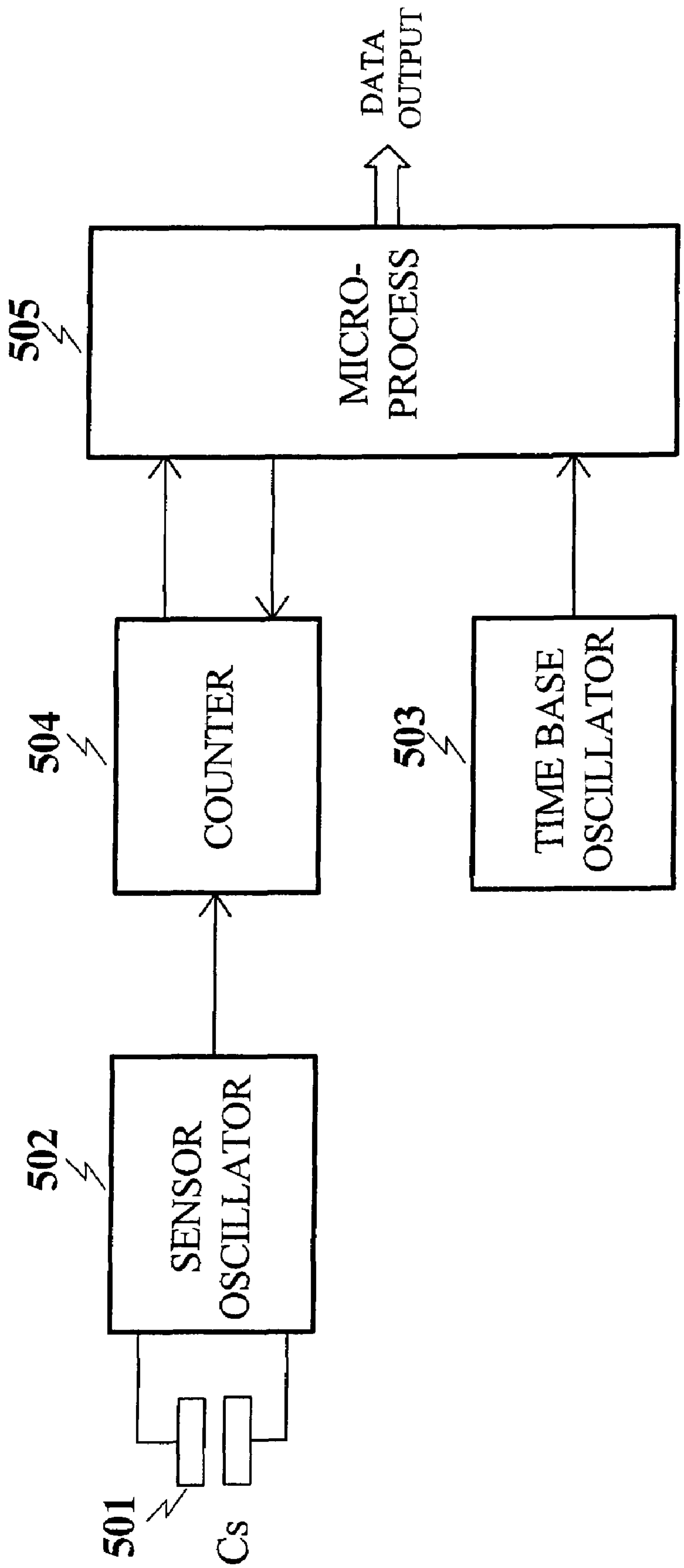
FIG. 9 is an object proximity detector in according to one embodiment of the present invention, which includes a pair of sensor plates, a sensor oscillator, a time base oscillator, a counter and a microprocessor.

The circuits of the present invention discussed above are oscillators used in object proximity detector or object position detector. An object proximity detector at least consists of a pair of sensor plates, a sensor oscillator, a time-base oscillator, a counter and a microprocessor. The system shown in FIG. 9 illustrates a proximity detector in according to one embodiment of the present invention. In FIG. 9 the system consists of a pair of sensor plates 501 connected to a sensor oscillator 502, a time base oscillator 503, a counter 504 and a microprocessor 505. The sensor oscillator 502 with the sensor plates 501 is a circuit which is described in FIG. 3, FIG. 5 or FIG. 7. The time base oscillator 503 provides system clock to the microprocessor 505. During the detection period of the system, a reference count ($N_0$) is stored in the microprocessor 505 and always updating. This reference count is defined as the counting number when there is not object in proximity of the sensor plates 501. And the reference count is also the maximum count ever measured in the counting process. A predetermined number ($N_r$) can be input to the microprocessor 505 and used to define the sensitivity of the object proximity sensor. In order to detect the proximity of an object, the counter 504 counts the frequency of the oscillator. If the counting number for a definite period is $N_x$, $N_0-N_x$ can measure the proximity of an object to the sensor plates 501. When $(N_0-N_x)>N_r$ is measured, we can determine that an object is in proximity to the sensor plates 501. A smaller $N_r$ means a more sensitive system. By input different $N_r$ to the microprocessor 505, the sensitivity of the object proximity detector can be programmed externally.

Figure 10:
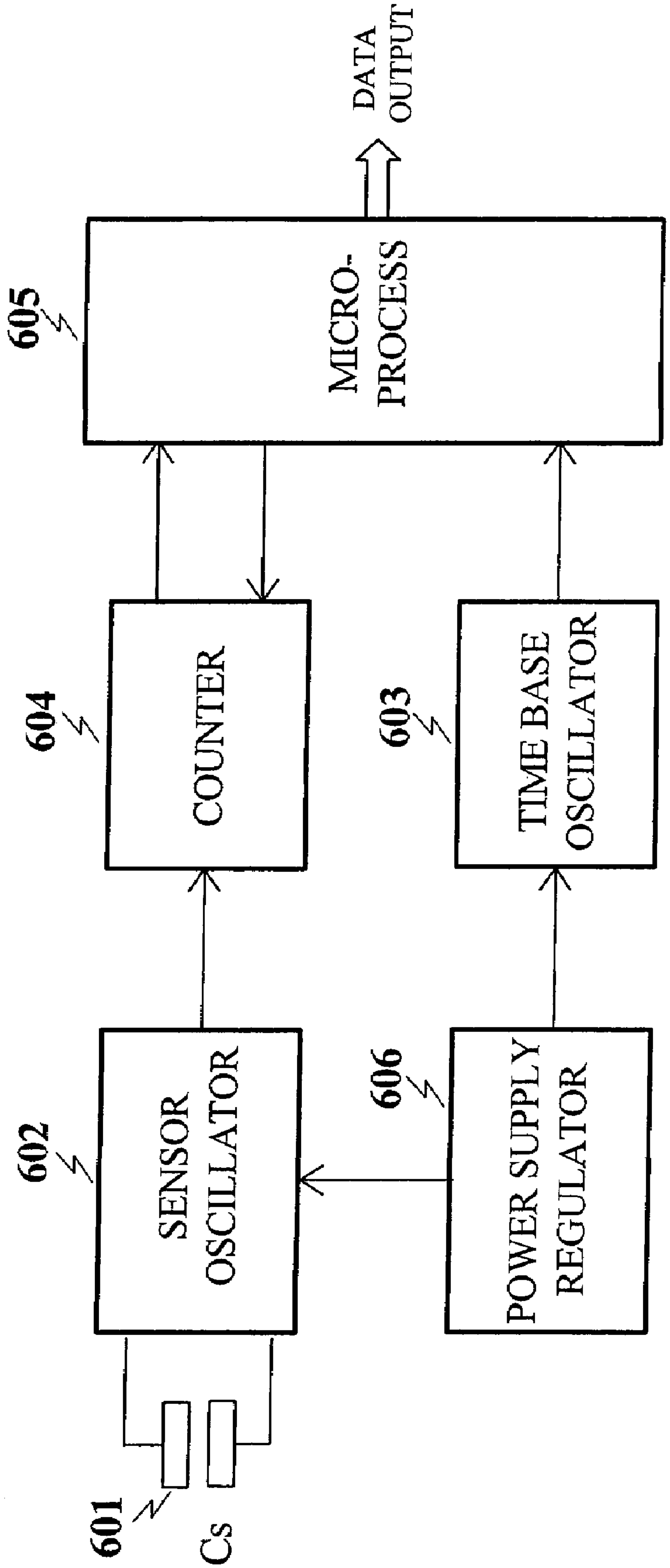
FIG. 10 is an object proximity detector in according to one embodiment of the present invention, which includes a pair of sensor plates, a sensor oscillator, a time base oscillator, a counter, a microprocessor and a power supply regulator. The power supply regulator is used to maintain the stability of the frequency of the oscillators.

The frequency of an oscillator will change with the variation of the power supply. In order to improve the stability of an object proximity detector, a system with a power supply regulator 606 is shown in FIG. 10. The power supplies of sensor oscillator 602 and time base oscillator 603 are provided by regulator 606. By this improvement, the system is more stable and higher sensitivity can be obtained.

The preceding method teaches us how to detect an object in proximity of a sensor. The technology can be expanded and modified to detect an object in proximity of an array of sensors, and to distinguish which sensor in the array is detected. We call this system as object position detector.

Figure 11:
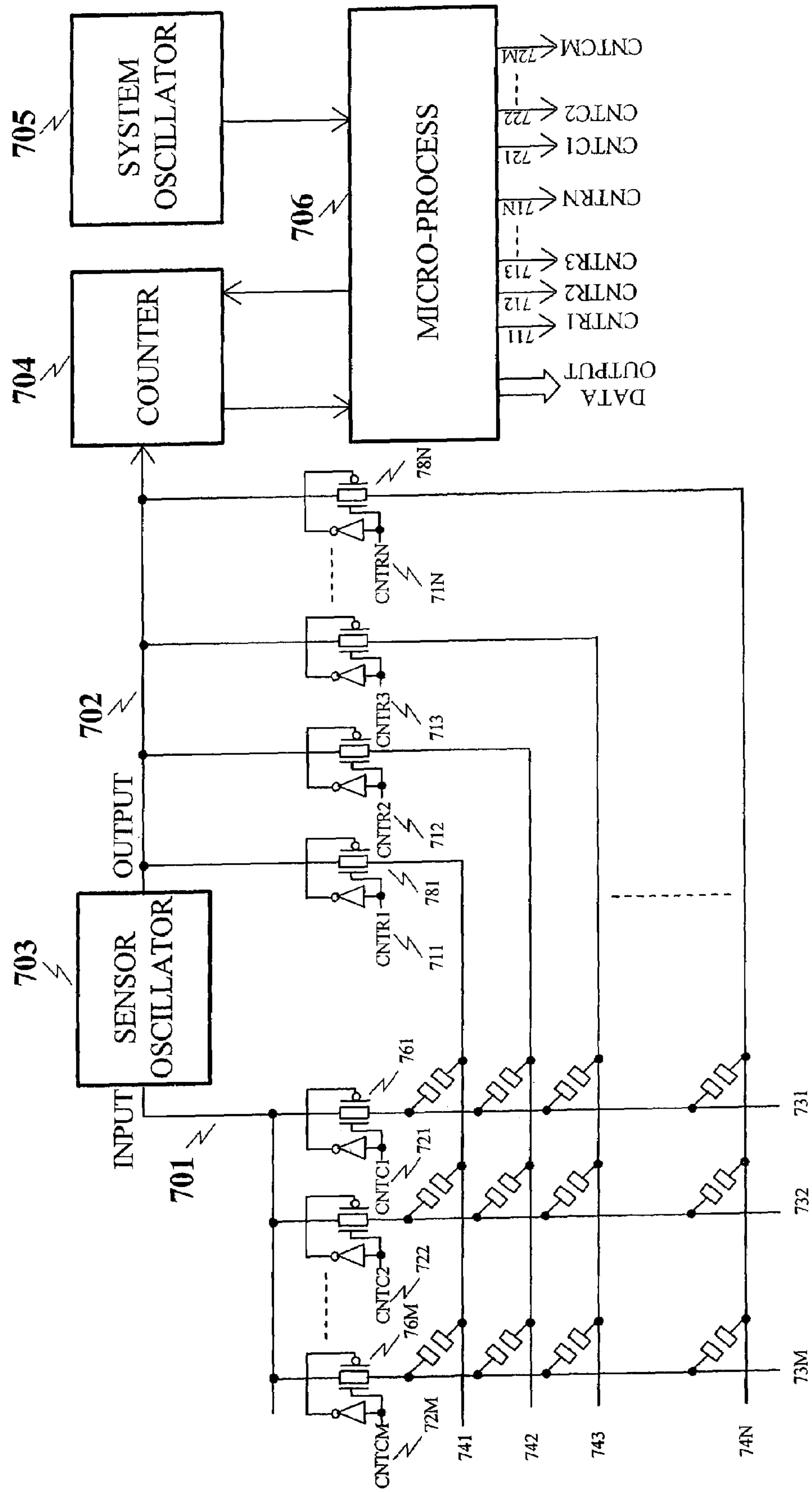
FIG. 11 is an object position detector in according to one embodiment of the present invention, which includes an array of sensor plates, two arrays of transmission gate, a sensor oscillator, a time base oscillator, a counter and a microprocessor.

FIG. 11 is one embodiment of an object position detector. In this circuit, there are M transmission gates (761 to 76M) connected in parallel at the input 701 of the sensor oscillator 703 and N transmission gates (781 to 78N) connected in parallel at the output 702 of the sensor oscillator 703. The output of these transmission gates can be used to form an M×N matrix. To form a sensor, we can connect one plate of a sensor plates to one of the M transmission gates (731 to 73M) and connect the other plate of the sensor plates to one of the N transmission gates (741 to 74N). The control gates (711 to 71N and 721 to 72M) of these transmission gates (781 to 78N and 761 to 76M) are connected to the outputs (711 to 71N and 721 to 72M) of a microprocessor 706, and are scanned sequentially by the microprocessor 706. A predetermined number ($N_r$) can be input to the microprocessor 706 and used to define the sensitivity of each key formed by the sensor plates. The reference count, $N_0$, of each key can be updated during the scanning of the key matrix. If $(N_0-N_x)>N_r$ is measured during the scanning of the key matrix, we can determine tat an object is in proximity to that key of key matrix.

Figure 12:
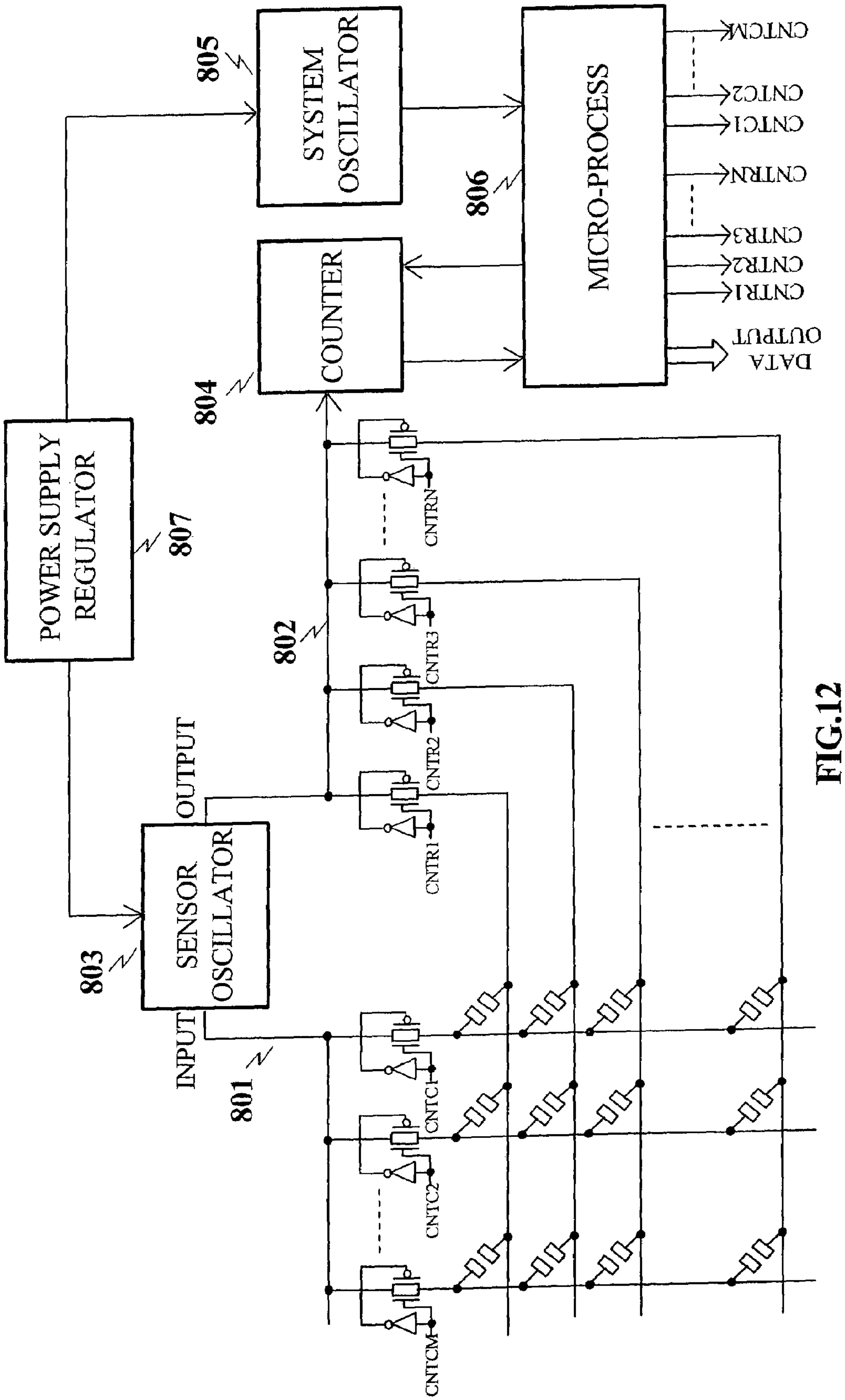
FIG. 12 is an object position detector in according to one embodiment of the present invention, which includes an array of sensor plates, two arrays of transmission gate, a sensor oscillator, a time base oscillator, a counter, a microprocessor and a power supply regulator. The power supply regulator is used to maintain the stability of the frequency of the oscillators.

The frequency stability of the oscillators in the object position detector can also be improved by adding a power supply regulator. FIG. 12 is an object position detector with power supply regulator 807. The power supply regulator 807 is used to provide the power supply for the sensor oscillator 803 and the time base oscillator 805. The output voltage of the regulator 807 will not change with the variation of the power supply. The stability of the frequency of the oscillators 803 and 805 is maintained. At this condition, smaller Nr can be input to the microprocessor 806 to get higher sensitivity.

Although specific embodiments of the invention have been disclosed, it will be understood by those having skill in the art that minor changes can be made to the form and details of the specific embodiments disclosed herein, without departing from the scope of the invention. The embodiments presented above are for purposes of example only and are not to be taken to limit the scope of the appended claims.

What is claimed is:

1. An object proximity detector, consisting of a pair of sensor plates connected to a sensor oscillator, sensing proximity of an object by the variation of the capacitance; a sensor oscillator, the variation of the capacitance changes the frequency of said sensor oscillator, the output of said sensor oscillator is connected to the input of a counter; a counter, counting the frequency of said sensor oscillator, the output is communicated with a micro-processor; a time base oscillator, providing system clock to a microprocessor; a microprocessor, calculating and processing the frequency count from said counter to determine an object is in proximity of the detector; wherein the improvement comprising:

said sensor oscillator consists of three inverters, a first inverter, a second inverter and a third inverter are in cascaded; a first capacitor is connected between the input of said first inverter and the ground; a pair of sensor plates is also connected between the input of said first inverter and the ground; a compensate capacitor is connected between the input of said first inverter and the output of said second inverter; a feedback resistor is connected between the input of said first inverter and the output of said third inverter; said feedback resistor is used to charge and discharge said first capacitor, said compensate capacitor and said sensor plates at the input of the oscillator; said first inverter is an inverter with Schmitt trigger input, said compensate capacitor is used to reduce the dependence of oscillator frequency on the process parameters.

2. An object proximity detector as recited in claim 1, further comprising:

a power supply regulator, connecting to said sensor oscillator and said time base oscillator to keep the frequency of said sensor oscillator and said time base oscillator stable.

3. An object proximity detector, consisting of a pair of sensor plates connected to a sensor oscillator, sensing the proximity of an object by the variation of the capacitance; a sensor oscillator, the variation of the capacitance changes the frequency of said sensor oscillator, the output of said sensor oscillator is connected to the input of a counter; a counter, counting the frequency of said sensor oscillator, the output is communicated with a micro-processor; a time base oscillator, providing system clock to a microprocessor; a microprocessor, calculating and processing the frequency count from said counter to determine an object is in proximity of the detector; wherein the improvement comprising:

said sensor oscillator consists of three inverters, a first inverter, a second inverter and a third inverter are in cascaded; a first capacitor is connected between the input of said first inverter and the ground; a pair of sensor plates is connected between the input of said first inverter and the output of said third inverter; a feedback resistor is connected between the input of said first inverter and the output of said third inverter; said feedback resistor is used to charge and discharge said first capacitor and said sensor plates at the input of the oscillator; said first inverter is an inverter with Schmitt trigger input, the connection of said sensor plates is used to increase the sensitivity of said object proximity detector.

4. An object proximity detector as recited in claim 3, further comprising:

a power supply regulator, connecting to said sensor oscillator and said time base oscillator to keep the frequency of said sensor oscillator and said time base oscillator stable.

5. An object proximity detector, consisting of a pair of sensor plates connected to a sensor oscillator, sensing the proximity of an object by the variation of the capacitance; a sensor oscillator, the variation of the capacitance changes the frequency of said sensor oscillator, the output of said sensor oscillator is connected to the input of a counter; a counter, counting the frequency of said sensor oscillator, the output is communicated with a microprocessor; a time base oscillator, providing system clock to a microprocessor; a microprocessor, calculating and processing the frequency count from said counter to determine an object is in proximity of the detector, wherein the improvement comprising:

said sensor oscillator consists of three inverters, a first inverter, a second inverter and a third inverter are in cascaded; a first capacitor is connected between the input of said first inverter and ground; a pair of sensor plates is connected between the input of said first inverter and the output of said third inverter; a compensate capacitor is connected between the input of said first inverter and the output of said second inverter; a feedback resistor is connected between the input of said first inverter and the output of said third inverter; said feedback resistor is used to charge and discharge said first capacitor, said compensate capacitor and said sensor plates at the input of said sensor oscillator; said first inverter is an inverter with Schmitt trigger input, said compensate capacitor is used to reduce the dependence of the oscillator frequency on the process parameters, the connection of said sensor plates is used to increase the sensitivity of said object proximity detector.

6. An object proximity detector as recited in claim 5, further comprising:

a power supply regulator, connecting to said sensor oscillator and said time base oscillator to keep the frequency of said sensor oscillator and said time base oscillator stable.

7. An object position detector, consisting a sensor oscillator; a time base oscillator, providing system clock to a microprocessor; a counter, counting the frequency of said sensor oscillator; a column of transmission gate connected to the input of said sensor oscillator; a row of transmission gate connected to the output of said sensor oscillator; said column of transmission gate and said row of transmission gate form a key matrix; each key of said key matrix is formed by a pair of sensor plates, with one plate connected to the input of said sensor oscillator through the output of said transmission gate, and the other plate connected to the output of said sensor oscillator through the output of said transmission gate; the control inputs of said transmission gates are scanned by a microprocessor; a microprocessor, calculating and processing the frequency count from said counter to determine one or multiple objects is in proximity to which sensor plates of said sensor array, to determine the position of one or multiple object in said sensor array; wherein the improvement comprising:

said sensor oscillator consisting of three inverters: a first inverter, a second inverter and a third inverter in cascaded; a first capacitor is connected between the input of said first inverter and the ground; a pair of sensor plates is also connected between the input of said first inverter and the ground; a compensate capacitor is connected between the input of said first inverter and the output of a second inverter; a feedback resistor is connected between the input of said first inverter and the output of said third inverter; said feedback resistor is used to charge and discharge said first capacitor, said compensate capacitor and said sensor plates at the input of the oscillator; said first inverter is an inverter with Schmitt trigger input; said compensate capacitor is used to reduce the dependence of oscillator frequency on the process parameters.

8. An object position detector as recited in claim 7, further comprising:

a power supply regulator, connecting to said sensor oscillator and said time base oscillator to keep the frequency of said sensor oscillator and said time base oscillator stable.

9. An object position detector, consisting a sensor oscillator; a time base oscillator, providing system clock to a microprocessor; a counter, counting the frequency of said sensor oscillator; a column of transmission gate connected to the input of said sensor oscillator; a row of transmission gate connected to the output of said sensor oscillator; said column of transmission gate and said row of transmission gate form a key matrix; each key of said key matrix is formed by a pair of sensor plates, with one plate connected to the input of said sensor oscillator through the output of said transmission gate, and the other plate connected to the output of said sensor oscillator through the output of said transmission gate; the control inputs of said transmission gates are scanned by a microprocessor; a microprocessor, calculating and processing the frequency count from said counter to determine one or multiple objects is in proximity to which sensor plates of said sensor array, to determine the position of one or multiple object in said sensor array; wherein the improvement comprising:

said sensor oscillator consists of three inverters, a first inverter, a second inverter and a third inverter are in cascaded; a first capacitor is connected between the input of said first inverter and the ground; a pair of sensor plates is connected between the input of said first inverter and the output of said third inverter; a feedback resistor is connected between the input of said first inverter and the output of said third inverter; said feedback resistor is used to charge and discharge said first capacitor and said sensor plates at the input of the oscillator; said first inverter is an inverter with Schmitt trigger input; the connection of said sensor plates is used to increase the sensitivity of said object position detector.

10. An object position detector as recited in claim 9, further comprising:

a power supply regulator, connecting to said sensor oscillator and said time base oscillator to keep the frequency of said sensor oscillator and said time base oscillator stable.

11. An object position detector, consisting a sensor oscillator; a time base oscillator, providing system clock to a microprocessor; a counter, counting the frequency of said sensor oscillator; a column of transmission gate connected to the input of said sensor oscillator; a row of transmission gate connected to the output of said sensor oscillator; said column of transmission gate and said row of transmission gate form a key matrix; each key of said key matrix is formed by a pair of sensor plates, with one plate connected to the input of said sensor oscillator through the output of said transmission gate, and the other plate connected to the output of said sensor oscillator through the output of said transmission gate; said transmission gates are scanned by a microprocessor; a microprocessor, calculating and processing the frequency count from said counter to determine one or multiple objects is in proximity to which sensor plates of said sensor array, to determine the position of one or multiple object in said sensor array; wherein the improvement comprising:

said sensor oscillator consists of three inverters, a first inverter, a second inverter and a third inverter are in cascaded; a first capacitor is connected between the input of said first inverter and the ground; a pair of sensor plates is connected between the input of said first inverter and the output of said third inverter; a compensate capacitor is connected between the input of said first inverter and the output of said second inverter; a feedback resistor is connected between the input of said first inverter and the output of said third inverter; said feedback resistor is used to charge and discharge said first capacitor, said compensate capacitor and said sensor plates at the input of the oscillator; said first inverter is an inverter with Schmitt trigger input; said compensate capacitor is used to reduce the dependence of oscillator frequency on process parameters, the connection of said sensor plates is used to increase the sensitivity of said object proximity detector.

12. An object position detector as recited in claim 11, further comprising:

a power supply regulator, connecting to said sensor oscillator and said time base oscillator to keep the frequency of said sensor oscillator and said time base oscillator stable.

* * * * *